(12) United States Patent
Morgan

(10) Patent No.: US 10,869,394 B1
(45) Date of Patent: Dec. 15, 2020

(54) APPARATUS AND METHODS FOR REDUCING UNINTENDED TRANSPORT OF DATA FROM POWER DISTRIBUTION SYSTEMS USING LAYERED POWER FILTERS

(71) Applicant: MANAGEMENT SERVICES GROUP, INC., Virginia Beach, VA (US)

(72) Inventor: Thomas S. Morgan, Virginia Beach, VA (US)

(73) Assignee: MANAGEMENT SERVICES GROUP, INC., Virginia Beach, VA (US)

( * ) Notice: Subject to any disclaimer, the term of this patent is extended or adjusted under 35 U.S.C. 154(b) by 0 days.

(21) Appl. No.: 16/938,212

(22) Filed: Jul. 24, 2020

Related U.S. Application Data

(60) Provisional application No. 62/942,432, filed on Dec. 2, 2019.

(51) Int. Cl.
*H05K 1/18* (2006.01)

(52) U.S. Cl.
CPC ..... *H05K 1/181* (2013.01); *H05K 2201/1006* (2013.01)

(58) Field of Classification Search
CPC .................. H05K 1/181; H05K 2201/1006
USPC .......................................................... 361/760
See application file for complete search history.

(56) References Cited

U.S. PATENT DOCUMENTS

| | | |
|---|---|---|
| 6,867,575 B2 | 3/2005 | Jacob |
| 7,061,987 B1 | 6/2006 | Tan et al. |
| 7,462,955 B2 | 12/2008 | McNamara et al. |
| 7,948,862 B2 | 5/2011 | Parnaby |
| 8,179,705 B2 | 5/2012 | Chapuis |
| 8,582,330 B2 | 11/2013 | Kalms et al. |
| 9,008,193 B2 | 4/2015 | Sutterlin |
| 9,812,864 B2 | 11/2017 | Temkin et al. |
| 9,917,440 B2 | 3/2018 | Luh et al. |
| 9,997,939 B2 | 6/2018 | Li |
| 10,050,518 B2 | 8/2018 | Lim et al. |
| 10,348,180 B2 | 7/2019 | Bhowmik et al. |
| 10,547,191 B2 | 1/2020 | Mckenna et al. |
| 2004/0239773 A1* | 12/2004 | Bleau ............. H04N 5/335 348/211.99 |
| 2014/0246906 A1* | 9/2014 | Wang ............. G06F 1/26 307/23 |
| 2018/0150092 A1 | 5/2018 | Morioni |

OTHER PUBLICATIONS

Le et al., "A Single-Inductor Switching DC-DC Converter With Five Outputs and Ordered Power-Distributive Control," IEEE Journal of Solid-State Circuits vol. 42, No. 12, pp. 1-11 (2007).

* cited by examiner

*Primary Examiner* — Binh B Tran
(74) *Attorney, Agent, or Firm* — Cooley LLP

(57) ABSTRACT

In some embodiments, a method includes receiving, at a circuit board, a power from a power supply. The method further includes filtering, at the circuit board and via a power filter having at least three choke filters, the power to produce a filtered power. The method further includes dividing, at a first portion of a circuit on the circuit board, a power associated with the filtered power into a first power and a second power, a characteristic of the first power differing from a characteristic of the second power by a factor of at least 1.5 or at most one half.

23 Claims, 3 Drawing Sheets

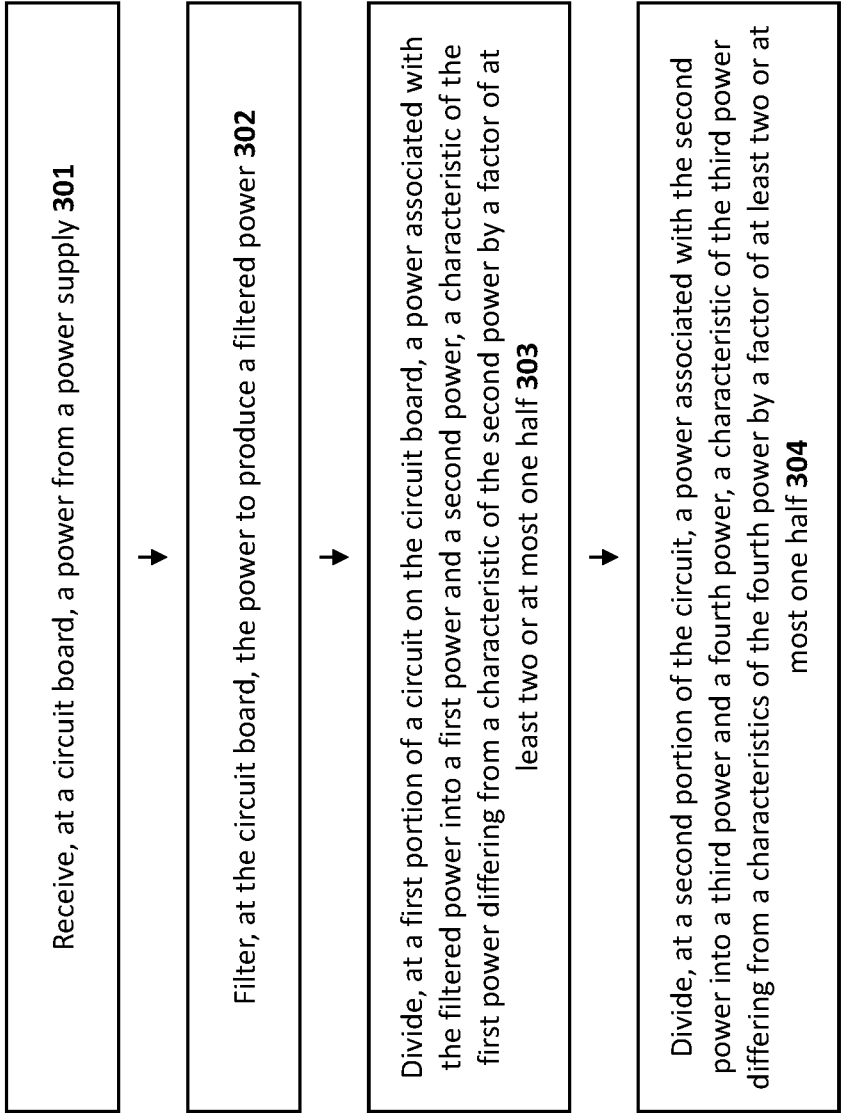

US 10,869,394 B1

APPARATUS AND METHODS FOR REDUCING UNINTENDED TRANSPORT OF DATA FROM POWER DISTRIBUTION SYSTEMS USING LAYERED POWER FILTERS

CROSS REFERENCE TO RELATED APPLICATION

This application claims priority to and the benefit of U.S. Patent Application No. 62/942,432, filed Dec. 2, 2019 and entitled "Power Distribution System," which is incorporated herein by reference in its entirety.

TECHNICAL FIELD

The present disclosure relates to the field power distribution systems, and in particular to methods and apparatus related to a circuit board having layered power filters in which the power filters can preclude or reduce unintended and/or intended transport of data from incoming or outgoing power.

BACKGROUND

Some known electronic circuitry, compute devices, or communication devices can include power distribution systems that are intended to solely distribute power. In some instances, however, electronic components of the electronic circuitry around the power distribution systems can induce data/information in the form of an electric or electromagnetic signal into the power distribution systems. Known power distribution systems do not effectively filter an incoming power to reduce/mitigate such information/data being induced into the power distribution system and out of the electronic circuitry, compute devices or communication devices. Thus, a need exists for power distribution systems with layered power supply filters as described herein, that improve information security and/or operation reliability of the electronic circuitry or digital processing systems.

SUMMARY

In some embodiments, a method includes receiving, at a circuit board, a power from a power supply. The method further includes filtering, at the circuit board and via a power filter having at least three choke filters, the power to produce a filtered power. The method further includes dividing, at a first portion of a circuit on the circuit board, a power associated with the filtered power into a first power and a second power, a characteristic of the first power differing from a characteristic of the second power by a factor of at least 1.5 or at most one half. In some embodiments, the method further includes dividing, at a second portion of the circuit, a power associated with the second power into a third power and a fourth power, a characteristic of the third power differing from a characteristic of the fourth power by a factor of at least 1.5 or at most one half.

BRIEF DESCRIPTION OF THE DRAWINGS

FIG. 3 is a flowchart of a method for supplying filtered power, according to an embodiment.

DETAILED DESCRIPTION

Non-limiting examples of various aspects and variations of the embodiments are described herein and illustrated in the accompanying drawings.

One or more embodiments described herein generally relate to methods, apparatus, and systems that use a circuit board with layered power filtering to restrain the power supply from acting as an unintended transport medium for data, thus increasing security of data as well as restricting data transport to an expected data transport medium. Generally, electronic devices, ranging from small embedded electronic devices to large electronic systems can include a power distribution system and electronic circuitry near the power distribution systems as a whole, near individual components of the power distribution systems, and/or near individual power transport mediums of the power distribution system. In some instances, information from the electronic circuitry can be unintentionally induced (e.g., electromagnetic induction) to the power distribution system. Therefore, such power distribution systems can potentially transport information via power transport mediums to an unintended recipient device (e.g., outside of and separate from the electronic circuitry) and expose the information. Such unintended transport of information to power distribution systems and subsequently power transport mediums can be reduced or prevented using a circuit board having the layered power filtering described herein.

Described herein are examples of circuit boards having layered power filtering that is suitable for highly secure and reliable computing, storage, and/or communication systems. One or more of the circuit boards having layered power filtering described herein include one or more power filtering stages that can filter and change characteristics of an input power from a power source (e.g., an untrusted power source or a trusted power source) at each filtering stage as an extra measure of protection in compromising environments. Moreover, one or more of the circuit boards having layered power filtering described herein can reduce or prevent noise and other data induced from surrounding electronic circuitry.

Electronic circuitry surrounding or near the one or more circuit boards described herein can generate noise in various electrostatic or electromagnetic forms, or inadvertently share data across a set of power lines powering the electronic circuitry and the one or more circuit boards. One or more of the circuit boards having layered power filtering described herein can effectively power multiple such components in a common closed spaces, compartments, or chassis.

Figure 1:
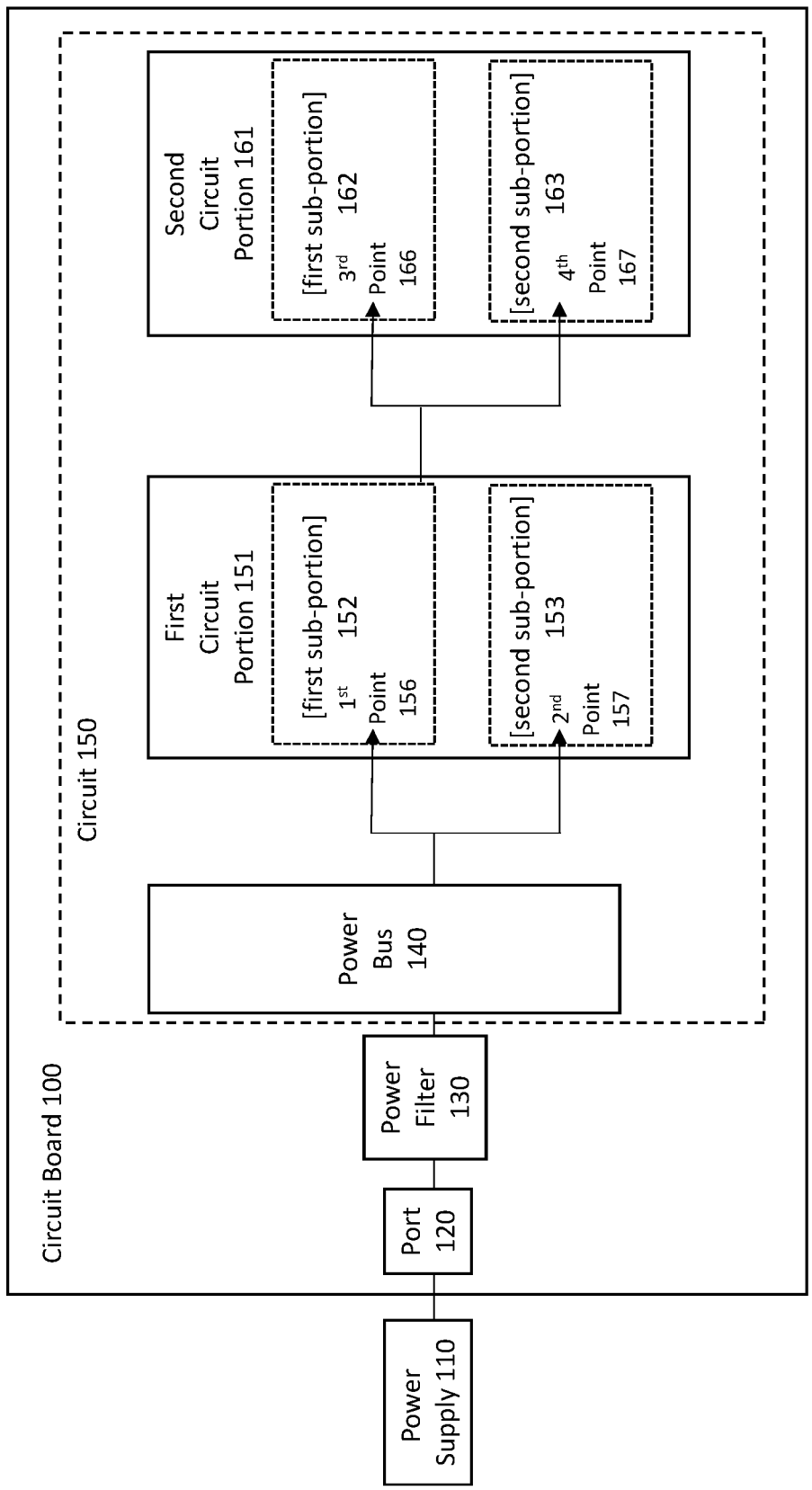
FIG. 1 is a block diagram that illustrates a layered power filtering circuit board, according to an embodiment.

FIG. 1 is a block diagram that illustrates circuit board 100 having a layered power filtering (also referred to herein as "the circuit board" or "layered power filtering circuit board"), according to an embodiment. The layered power filtering circuit board 100 can include a set of electric components mounted on a printed circuit board (PCB) that when operated precludes or reduces noise, ripple, and/or unintended data from power supplied by a power supply 110. Power supply 110 can be, for example, untrusted in the sense that the power supply is not controlled by the owner of the circuit board and may include or have access to malicious or undesired components or entities. Alternatively, power supply 110 can be, for example, trusted in the sense that the power supply is controlled by the owner of the circuit board or another owner trusted by the owner of the circuit board to not include malicious or undesired components or entities. The layered power filtering circuit board 100 includes a port 120 that is connected to and/or operatively coupled to the power supply 110 and receives a power from the power supply 110. The layered power filtering circuit board 100 further includes a power filter 130 disposed on the circuit board 100. The power filter 130 connects the port 120 to a power bus 140. The circuit board 100 can further include a first circuit portion 151 and a second circuit portion 161 that collectively define a circuit 150. The difference circuit portions 151, 161 can, for example, embody different functions of a device. For example, circuit portion 151 can embody the circuitry for a control plane of a router and circuit portion 161 can embody the circuitry for a data plane of the router. The layered power filtering circuit board 100 can be used in applications that use electronic circuitry and/or electric power including, for example, computers, sound amplifiers, phones, laptops, servers, communication systems, routers, telecommunication appliances (e.g., firewalls), sensor arrays, vehicles, aircrafts, robots, spacecraft, satellites, cell towers, power station security, baseband communication equipment, radio systems (one way, two-way, and/or multipoint), networking equipment, physical security of buildings, and/or the like.

The circuit board 100 is a board that can mechanically support and electrically interconnect electrical components (e.g., a capacitor(s), a resistor(s), an inductor(s) and/or the like) and/or electronic components (a transistor(s), a diode(s), light emitting diodes, logic gate circuits, integrated circuits, and/or the like). The circuit board 100 can further include conductive tracks (copper tracks, aluminum tracks, silver tracks, and/or the like), conductive sheets (copper sheets, aluminum sheets, and/or the like), insulating sheets (e.g., porcelain sheets, mica sheets, plastic sheets, and/or the like), and/or the like. In some instances, the circuit board 100 can include a power management unit (PMU), a system management controller (SMC), a system basis chip (SBC), and/or the like.

As mentioned above, the port 120 of the circuit board 100 is connected to and/or operatively coupled to a power source 110 to receive power. The power source 110 can be, for example, a device that generates power (e.g., a motor-generator), coverts power (e.g., a coil transformer), or a medium that conducts the power (e.g., a wire). In some instances, the power can be an alternating current (AC) electric power, a direct current (DC) electric power, an electromagnetic power, and/or the like. The power can have a set of characteristics such as, for example, a voltage, a wattage, a frequency, a current flow intensity, and/or the like. In some instances, the power can include noises, ripples, and/or unintended information/data encoded in the power. In some instances, the unintended information/data can be induced by an electromagnetic induction of a signal propagating in a data transfer link close to the power source 110 to the power from the power source 110. In some instances, the unintended information/data can be induced from a data bus connecting electronic circuitry within the circuit board 100 to a power cable providing electricity to an external electronic component connected to the circuit board 100.

The power filter 130 is disposed on the circuit board 100 and can be configured to receive the power from the power source 110 via the port 120. The power filter 130 has at least three choke filters and can filter the power to produce a filtered power. The at least three choke filters can be connected together is series. In other words, the power filter 130 can produce power having a base voltage and a base frequency that is provided to the power bus 120. The power filter 130 can be connected to the power bus 120 and transmit the filtered power to the power bus 120. One choke filter from the at least three choke filters connected in series (also referred to as the "last choke filter") is also connected directly to the power bus 120. For the last choke filter, the power just before the last choke filter has at least one characteristic that is different from at least one characteristic of the power just after the last choke filter by a factor of at least 1.5 or at most one half (e.g., a factor of 1.5, a factor of 2, a factor of 3, a factor of 5, a factor of 100, a factor of ⅓, a factor of ⅕, a factor of ¹/₁₀₀, and/or the like). As described elsewhere herein, a set of characteristics of the power can be, for example, a voltage, a wattage, a frequency, a current flow intensity, and/or the like. In some implementations, the power filter 130 can be made of a set of electric components such as a resistor(s), a capacitor(s), an inductor(s), and/or the like that are connected by wires in series configuration and/or in parallel configuration to filter out noise, ripples, and/or unintended information/data from the power. For example, in some instances, the power filter 130 can include an active filter(s) (such as a shunt filter(s), a series filter(s) and/or a hybrid filter(s)) and/or a passive filter(s) (such as shunt filter(s), a series filter(s), a hybrid filter(s), a single-tuned filter(s), a double-tuned filter(s), a damped filter(s), a low pass filter(s), a band pass filter(s), a high pass filter(s), a current limiter circuit(s), a voltage limiter circuit(s)), and/or the like.

The power bus 140 of the circuit board 100 is an electrical system that can include and interconnect several electric components such as, for example, a generator(s), a load(s), and/or the like. The power bus 140 can be disposed on the circuit 150 between and operatively coupled to the power filter 130 and a first circuit portion 151 of the circuit 150. The power bus 140 can be configured to distribute the filtered power to various parts of the circuit 150 including the first sub-portion 152 of the first circuit portion 151 and the second sub-portion 153 of the first circuit portion 151. The power bus 140 can distribute the filtered power to the first sub-portion 152 and the second sub-portion 153 at a first point 156 and second point 157. The power bus 140 can be disposed on the circuit board 100 between and operatively coupled to the power filter 130 and an input point (not shown) of the circuit 150.

The circuit 150 includes a first circuit portion 151 and can further include a second circuit portion 161 that is mutually exclusive from the first circuit portion 151. The first circuit portion 151 includes a first sub-portion 152 and a second sub-portion 153. The second circuit portion 161 includes a first sub-portion 162 and a second sub-portion 163. The first sub-portion 152 of the first circuit portion 151, the second sub-portion 153 of the first circuit portion 151, the first sub-portion 162 of the second circuit portion 161, and the second sub-portion 163 of the second circuit portion 161 can each be configured to perform a circuit function that operate best under a different set of power characteristics. For example the first sub-portion 152 of the first circuit portion can be configured to perform a set of power management procedures using a power with 50 kHz frequency and 20 Volts potential, while the second sub-portion 163 of the second circuit portion 161 can be configured to perform a set of signal communication procedures using a power with 100 kHz frequency and 200 Volts potential.

In some instances, the circuit 150 can be a power integrated circuit (PIC) that typically integrates a large number (e.g., tens, hundreds, thousands, millions, and/or the like) of electronic components (e.g., metal-oxide-semiconductor (MOS) transistors, charged-coupled optical sensor, floatinggate memory cell, and/or the like) made of a semiconductor(s) (e.g., silicon, silicon carbide, gallium arsenide, and/or the like), an insulator(s) (silicon oxide, silicon nitride, aluminum nitride, and/or the like), and/or a conductor(s) (silver, copper, indium tin oxide, and/or the like). The circuit can be configured to perform, for example, power management, dynamic voltage scaling, control procedures, arithmetic procedures, logical procedures, signal generation procedures, signal communication procedures, electronic charge storage procedures, and/or the like.

The first sub-portion 152 of the first circuit portion 151 receives a first power from the first point 156, and the second sub-portion 153 of the first circuit portion 151 receives a second power from the second point 157. The first sub-portion 162 of the second circuit portion 161 receives a third power from the third point 166, and the second sub-portion 163 of the second circuit portion 161 receives a fourth power from the fourth point 167. In some implementations, the first sub-portion 162 of the second circuit portion 161 receives the third power from the first sub-portion 152 of the first circuit portion 151, and the second sub-portion 163 of the second circuit portion 161 receives the fourth power from the second sub-portion 153 of the first circuit portion 151.

As shown in FIG. 1, the input point receives the filtered power and conducts the filtered power to the first circuit portion 151. The first circuit portion 151 is disposed on the circuit 150 and between and operatively coupled to the second circuit portion 161 and the input point. The first circuit portion 151 receives a first power from the input point at a first point 156 within the first circuit portion 151 and a second power from the input point at a second point 157 within the first circuit portion 151. The first power has at least one characteristic that is different from at least one characteristic of the second power by a factor of at least 1.5 or at most one half (e.g., a factor of 1.5, a factor of 2, a factor of 3, a factor of 5, a factor of 100, a factor of ⅓, a factor of ⅕, a factor of 1/100, and/or the like).

In some implementations, the second circuit portion 161 receives a third power from the first circuit portion 151 at a third point 166 and a fourth power from the first circuit portion 151 at a fourth point 167. The third power has at least one characteristic that is different from at least one characteristic of the fourth power by a factor of at least 1.5 or at most one half (e.g., a factor of 1.5, a factor of 2, a factor of 3, a factor of 5, a factor of 100, a factor of ⅓, a factor of ⅕, a factor of 1/100, and/or the like). Having different characteristics in each of the first power, the second power, the third power, and the fourth power reduces/prevents data being passed over the power systems of various portions and/or components of the circuit 150. Note that this implementation with the second circuit portion 161 is optional and not required for all embodiments. This implementation can be embodied where the first circuit portion 161 and the second circuit portion 162 are, for example, shielded separately for electromagnetic interference (EMI) and have separate access or authorization levels (e.g., the first circuit portion 161 can be governed by or associated with a first level of access or authorization, while the second portion 161 can be governed by or associated with a second level of access or authorization that is more restrictive than the first level of access or authorization).

In some instances, a characteristic of the first power is frequency and a characteristic of the second power is frequency, the frequency of the first power being at least twice the frequency of the second power. For example, the first power can have a frequency of 120 kHz that is larger than a frequency of 40 kHz of the second power by a factor of 3.

In some instances, the characteristic of the first power is voltage and the characteristic of the second power is voltage, the voltage of the first power being at least twice the voltage of the second power. For example, the first power can have a voltage of 5 Volts that is smaller than a voltage of 100 Volts of the second power by a factor of 0.05.

In some instances, the characteristic of the first power includes frequency and voltage, the characteristic of the second power includes frequency and voltage. One of the voltage or the frequency of the first power can be at least twice the voltage or the frequency, respectively, of the second power. For example, the first power can have a frequency of 50 kHz and a voltage of 5 Volts and the second power can have a frequency of 50 kHz that is the same frequency as the frequency of the first power and a voltage of 100 Volts that is larger than voltage of the first power by a factor of 20.

In some instances, the characteristic of the first power includes frequency and voltage, the characteristic of the second power includes frequency and voltage. Both the voltage and the frequency of the first power can be at least twice the voltage and the frequency, respectively, of the second power. For example, the first power can have a frequency of 50 kHz and a voltage of 5 Volts and the second power can have a frequency of 100 kHz and a voltage of 10 Volts that are both larger than the frequency of the first power and the voltage of the first power by a factor of 2.

Note that while the circuit portions themselves are not components or circuit portions solely dedicated to the function of power filtering, the different circuit portions can collectively act as a power filter(s) through their operation. More specifically, the frequency and/or voltage for one circuit portion relative to the frequency and/or voltage for another circuit portion within a given circuit can collectively act as a power filter when the frequency and/or voltage for the one circuit portion is at least twice or no more than half of the frequency and/or voltage, respectively, for the other circuit portion. It is believed that such an arrangement can act as a power filter due to reduction of passing of data over the power system between the two circuit portions. For example, when one circuit portion operates at a frequency of 50 kHz and the other circuit portion operates at a frequency of 100 kHz, the instances of when the electromotive forces of both circuit portions overlap or synchronize are reduced due to the differing frequencies, which in turn reduces the extent to which data can pass over the power system between the two circuit portions. Similarly, when one circuit portion operates at a voltage of 5 Volts and the other circuit portion operates at a voltage of 10 Volts, the electromotive forces from the higher voltage obscures the electromotive forces from lower voltage, which in turn reduces the extent to which data can pass over the power system between the two circuit portions.

In some embodiments, a housing (not shown) can be used to further reduce induction of noise or inductive information by electromagnetic effects to the circuit board 100. The housing can include an enclosure that can also help to protect and/or house various electronic components that make up the circuit board 100. For example, the housing can include a set of electromagnetic interference shields that reduces/blocks electromagnetic interference effects on the circuit board 100. In some embodiments, one or more components of the circuit board 100 can include individual housings that further protect each component from interference and/or induction effects from the rest of components within the circuit board 100, or vice versa protect the rest of components from interference and/or induction effects of each component.

The power filter 130 collectively with the frequency and/or voltage for one sub-portion (e.g., first sub-portion 152 or first sub-portion 162) relative to the frequency and/or voltage for another sub-portion (e.g., second sub-portion 153 or second sub-portion 163) can be considered as layers of power filtering of the circuit board 100. The power filter 130 acts as a first power filter layer, produces a first set of filtered power, and conducts the first set of filtered power to the power bus 140. The first set of filtered power can be divided/distributed with different voltage/frequency at the first point 156 and the second point 157 acting as a second power filter layer to produce a second set of filtered power for operation of the first circuit portion 151. The second set of filtered power can be divided/distributed with different voltage/frequency at the third point 166 and the fourth point 167 acting as a third power filter layer to produce a third set of filtered power for operation of the second circuit portion 161.

Figure 2:
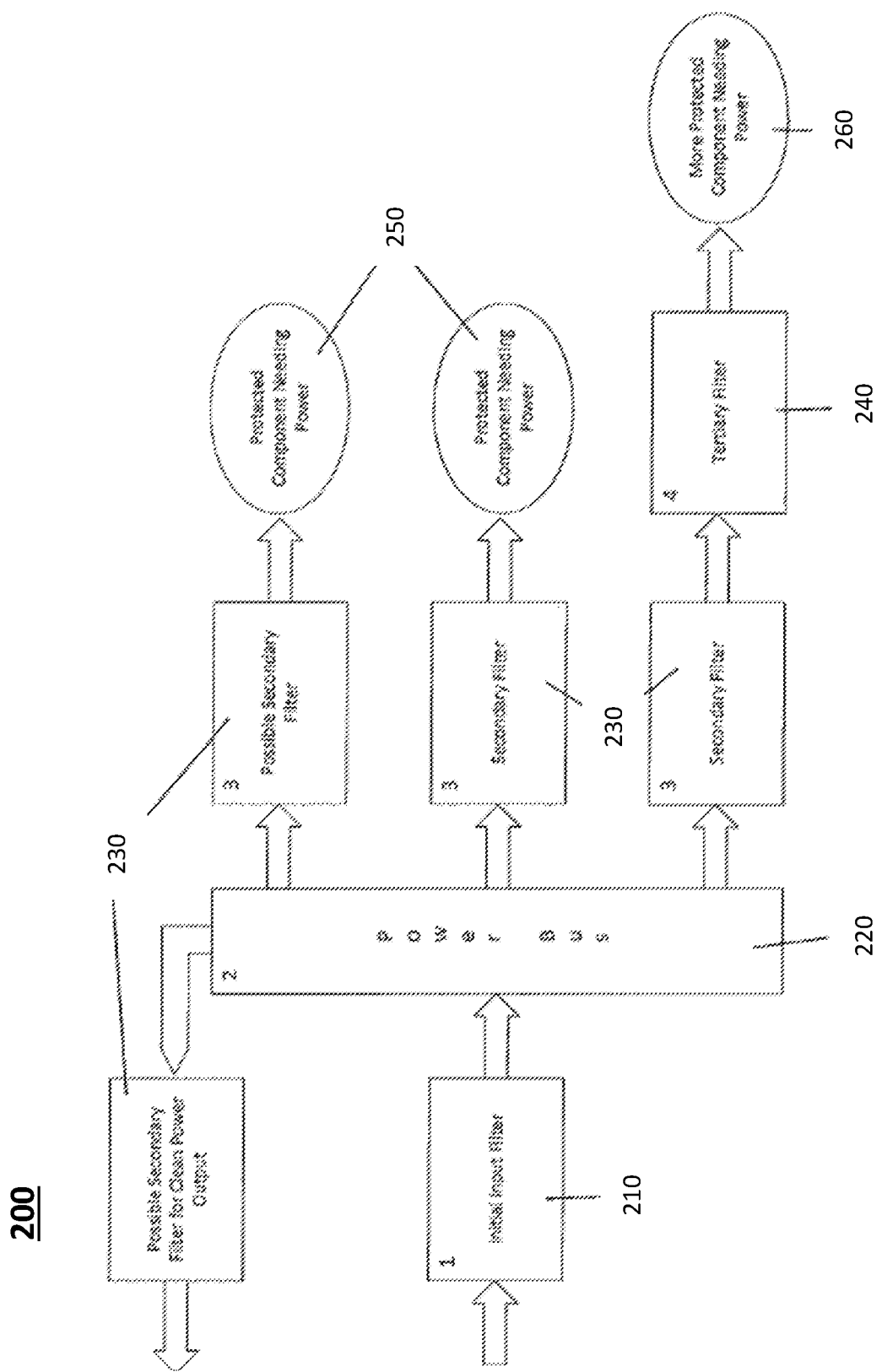
FIG. 2 is a block diagram that illustrates a layered power filtering circuit board, according to an embodiment.

FIG. 2 is a block diagram that illustrates a circuit board 200 having layered power filtering (similar to the circuit board 100 shown and described with respect to FIG. 1), according to an embodiment. The circuit board 200 includes an initial input filter 210, a power bus 220, and a set of electric and/or electronic components 250 (labeled "Protected Component Needing Power") that operate when powered by power. The circuit board 200 can optionally include a set of secondary filters 230 disposed between and operatively coupled to the power bus 220 and the set of protected components 250. The layered power filtering circuit board 200 can optionally include a set of tertiary filters 240 disposed between and operatively coupled to a subset of secondary filters from the set of secondary filters 230 and a set of more electric and/or electronic components 260 (labeled "More Protected Component Needing Power"). The layered power filtering described above can include at least three choke filter.

The arrows shown between various components of the circuit board 200 in FIG. 2 represent conduction/flow of power between the various components. The initial input filter 210 receives power, via an input port (not shown), from an untrusted or trusted power source (e.g., an AC power socket of a building, an electric vehicle, an aircraft, and/or the like), produces a first set of filtered power and conducts the first set of filtered power to the power bus 220. Each filtered power from the first set of filtered power from initial input filter 210 can have a first set of characteristics (e.g., a frequency, a voltage, a peak potential, and/or the like). The power bus 220 can distribute the first set of filtered power between the set of electric and/or electronic components 250 (e.g., a set of circuits).

The set of secondary filters 230 can further filter the first set of filtered power to produce a second set of filtered power having a second set of characteristics, and conduct the second set of filtered power to the set of components 250. In some implementations, the set of tertiary filters 240 can further filter a subset of the second set of filtered power to produce a third set of filtered power having a third set of characteristics, and conduct the third set of filtered power to the set of more components 260.

In some implementations, the circuit board 200 can include a set of output ports (not shown) that receive filtered/clean power from the first set of filtered power of the power bus 220 and provide filtered/clean power to an external device (e.g., a peripheral device, an extension board, and/or the like). In some instances, a secondary filter from the set of secondary filters can be disposed between and operatively coupled to the power bus 220 and the output port. In some instances, a tertiary filter from the set of tertiary filters 240 can be disposed between and operatively coupled to a secondary filter from the set of secondary filters 230 and the set of more components 260.

In some instances, each filter from the initial input filter 210, the set of secondary filters 230, and the set of tertiary filters 240 can be configured to change characteristics (e.g., frequency, voltage, and/or the like) of an incoming power in addition to filtering the incoming power. Therefore, each filter produces a filtered power that has less noise and different characteristics compared to its corresponding incoming power.

In some embodiments, the layered power filtering of FIG. 1 and FIG. 2 can be implemented on a set of circuit boards instead of one circuit board. In one example with respect to FIG. 2, each secondary filter from the set of secondary filters and/or each component from the set of electric and/or electronic components 250 can be mounted on a separate circuit board.

FIG. 3 is a flowchart of a method 300 for supplying filtered power, according to an embodiment. The method 300 can be implemented/performed by a circuit board having layered power filtering (similar to the circuit board 100 shown and described with respect to FIG. 1). At 301, the circuit board receives a power from an untrusted or trusted power supply. At 302, the circuit board filters the power to produce a filtered power. The filtering of power can be achieved by a power filter (similar to the power filter 130 as shown and described with respect to FIG. 1) made of a set of electric components such as a resistor(s), a capacitor(s), an inductor(s), and/or the like that are connected by wires in series configuration and/or in parallel configuration to filter out noise, ripples, and/or unintended information/data from the power.

At 303, the layered power filtering circuit board divides, at a first portion of the circuit board, a power associated with the filtered power into a first power and a second power. A characteristic of the first power differs from a characteristic of the second power by a factor of at least 1.5 or at most one half. At 304, the circuit board divides, at a second portion of the circuit board, a power associated with the second power into a third power and a fourth power. A characteristic of the third power can differ from a characteristics of the fourth power by a factor of at least 1.5 or at most one half.

It should be understood that the disclosed embodiments are not intended to be exhaustive, and functional, logical, operational, organizational, structural and/or topological modifications may be made without departing from the scope of the disclosure. As such, all examples and/or embodiments are deemed to be non-limiting throughout this disclosure.

All definitions, as defined and used herein, should be understood to control over dictionary definitions, definitions in documents incorporated by reference, and/or ordinary meanings of the defined terms.

Examples of computer code include, but are not limited to, micro-code or micro-instructions, machine instructions, such as produced by a compiler, code used to produce a web service, and files containing higher-level instructions that are executed by a computer using an interpreter. For example, embodiments can be implemented using Python, Java, JavaScript, C++, and/or other programming languages and development tools. Additional examples of computer code include, but are not limited to, control signals, encrypted code, and compressed code.

The drawings primarily are for illustrative purposes and are not intended to limit the scope of the subject matter described herein. The drawings are not necessarily to scale; in some instances, various aspects of the subject matter disclosed herein can be shown exaggerated or enlarged in the drawings to facilitate an understanding of different features. In the drawings, like reference characters generally refer to like features (e.g., functionally similar and/or structurally similar elements).

The acts performed as part of a disclosed method(s) can be ordered in any suitable way. Accordingly, embodiments can be constructed in which processes or steps are executed in an order different than illustrated, which can include performing some steps or processes simultaneously, even though shown as sequential acts in illustrative embodiments. Put differently, it is to be understood that such features may not necessarily be limited to a particular order of execution, but rather, any number of threads, processes, services, servers, and/or the like that may execute serially, asynchronously, concurrently, in parallel, simultaneously, synchronously, and/or the like in a manner consistent with the disclosure. As such, some of these features may be mutually contradictory, in that they cannot be simultaneously present in a single embodiment. Similarly, some features are applicable to one aspect of the innovations, and inapplicable to others.

Where a range of values is provided, it is understood that each intervening value, to the tenth of the unit of the lower limit unless the context clearly dictates otherwise, between the upper and lower limit of that range and any other stated or intervening value in that stated range is encompassed within the disclosure. That the upper and lower limits of these smaller ranges can independently be included in the smaller ranges is also encompassed within the disclosure, subject to any specifically excluded limit in the stated range. Where the stated range includes one or both of the limits, ranges excluding either or both of those included limits are also included in the disclosure.

The phrase "and/or," as used herein in the specification and in the embodiments, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements can optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the embodiments, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the embodiments, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of," or "exactly one of" "Consisting essentially of," when used in the embodiments, shall have its ordinary meaning as used in the field of patent law.

As used herein in the specification and in the embodiments, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements can optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the embodiments, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. An apparatus, comprising:
a circuit board configured to be coupled to a power supply via a port of the circuit board;
a circuit disposed on the circuit board, the circuit including a power bus and a first circuit portion; and
a power filter disposed on the circuit board and between the port and the power bus, the power filter having at least three choke filters, the power bus being operatively coupled to the power filter and the first circuit portion,
the first circuit portion configured to receive a first power from the power bus at a first point within the first circuit portion and a second power from the power bus at a second point within the first circuit portion, a characteristic of the first power differing from a characteristic of the second power by a factor of at least 1.5 or at most one half.

2. The apparatus of claim 1, wherein the characteristic of the first power is frequency and the characteristic of the second power is frequency, the frequency of the first power being at least twice the frequency of the second power.

3. The apparatus of claim 1, wherein the characteristic of the first power is voltage and the characteristic of the second power is voltage, the voltage of the first power being at least twice the voltage of the second power.

4. The apparatus of claim 1, wherein the characteristic of the first power includes frequency and voltage, the characteristic of the second power includes frequency and voltage, one of the voltage or the frequency of the first power being at least twice the voltage or the frequency, respectively, of the second power.

5. The apparatus of claim 1, wherein the characteristic of the first power includes frequency and voltage, the characteristic of the second power includes frequency and voltage, the voltage and the frequency of the first power being at least twice the voltage and the frequency, respectively, of the second power.

6. The apparatus of claim 1, wherein:
the circuit includes a second circuit portion mutually exclusive from the first circuit portion, the first circuit portion is operatively coupled between the power bus and the second circuit portion,
the second circuit portion configured to receive power from the first circuit portion at a third point and convert the power from the first circuit portion to a third power and a fourth power at a fourth point, a characteristic of the third power differing from a characteristics of the fourth power by a factor of at least 1.5 or at most one half.

7. The apparatus of claim 1 wherein:
the first circuit portion includes a first sub-portion and a second sub-portion, the first sub-portion of the first circuit portion including the first point and configured to receive the first power, the second sub-portion of the first circuit portion including the second point and configured to receive the second power,
the second circuit portion includes a first sub-portion and a second sub-portion, the first sub-portion of the second circuit including the third point and configured to receive the third power, the second sub-portion of the second circuit including the fourth point and configured to receive the fourth power.

8. The apparatus of claim 1 wherein:
the first circuit portion includes a first sub-portion and a second sub-portion, the first sub-portion of the first circuit portion including the first point and configured to receive the first power, the second sub-portion of the first circuit portion including the second point and configured to receive the second power,
the second circuit portion includes a first sub-portion and a second sub-portion, the first sub-portion of the second circuit including the third point and configured to receive the third power from the first sub-portion of the first circuit portion, the second sub-portion of the second circuit including the fourth point and configured to receive the fourth power from the first sub-portion of the first circuit portion.

9. The apparatus of claim 7, wherein:
the characteristic of the first power is frequency and the characteristic of the second power is frequency, the frequency of the first power being at least twice the frequency of the second power,
the characteristic of the third power is frequency and the characteristic of the fourth power is frequency, the frequency of the third power is at least twice the frequency of the fourth power,
the frequency of the fourth power being at least twice the frequency of the second power.

10. A method, comprising:
receiving, at a circuit board and via a power filter having at least three choke filters, a power from a power supply; and
filtering, at the circuit board, the power to produce a filtered power;
dividing, at a first portion of a circuit on the circuit board, a power associated with the filtered power into a first power and a second power, a characteristic of the first power differing from a characteristic of the second power by a factor of at least 1.5 or at most one half.

11. The method of claim 10, wherein the characteristic of the first power is frequency and the characteristic of the second power is frequency, the frequency of the first power being at least twice the frequency of the second power.

12. The method of claim 10, wherein the characteristic of the first power is voltage and the characteristic of the second power is voltage, the voltage of the first power being at least twice the voltage of the second power.

13. The method of claim 10, wherein the characteristic of the first power includes frequency and voltage, the characteristic of the second power includes frequency and voltage, one of the voltage or the frequency of the first power being at least twice the voltage or the frequency, respectively, of the second power.

14. The method of claim 10, wherein the characteristic of the first power includes frequency and voltage, the characteristic of the second power includes frequency and voltage, the voltage and the frequency of the first power being at least twice the voltage and the frequency, respectively, of the second power.

15. The method of claim 10, further comprising:
dividing, at a second portion of the circuit, a power associated with the second power into a third power and a fourth power, a characteristic of the third power differing from a characteristics of the fourth power by a factor of at least 1.5 or at most one half.

16. An apparatus, comprising:
a circuit including an input point and a first circuit portion, the input point configured to receive power that has been filtered by a power filter that (1) received power from a power source and (2) has at least three choke filters,
the first circuit portion configured to receive a first power from the input point at a first point within the first circuit portion and a second power from the input point at a second point within the first circuit portion, a characteristic of the first power differing from a characteristic of the second power by a factor of at least 1.5 or at most one half.

17. The apparatus of claim 16, further comprising:
a circuit board including a port, the circuit being disposed with the circuit board, the port of the circuit board operatively coupled to the input point of the circuit and configured to receive the power from the power source.

18. The apparatus of claim 16, further comprising:
a power filter; and
a power bus disposed between and operatively coupled to the power filter and the input point of the circuit.

19. The apparatus of claim 16, wherein the characteristic of the first power is frequency and the characteristic of the second power is frequency, the frequency of the first power being at least twice the frequency of the second power.

20. The apparatus of claim 16, wherein the characteristic of the first power is voltage and the characteristic of the second power is voltage, the voltage of the first power being at least twice the voltage of the second power.

21. The apparatus of claim 16, wherein the characteristic of the first power includes frequency and voltage, the characteristic of the second power includes frequency and voltage, one of the voltage or the frequency of the first power being at least twice the voltage or the frequency, respectively, of the second power.

22. The apparatus of claim 16, wherein the characteristic of the first power includes frequency and voltage, the characteristic of the second power includes frequency and voltage, the voltage and the frequency of the first power being at least twice the voltage and the frequency, respectively, of the second power.

23. The apparatus of claim 16, wherein:
the circuit includes a second circuit portion mutually exclusive from the first circuit portion, the first circuit portion is operatively coupled between the input point and the second circuit portion,
the second circuit portion configured to receive power from the first circuit portion at a third point and convert the power from the first circuit portion to a third power and a fourth power at a fourth point, a characteristic of the third power differing from a characteristics of the fourth power by a factor of at least 1.5 or at most one half.

* * * * *

UNITED STATES PATENT AND TRADEMARK OFFICE
CERTIFICATE OF CORRECTION

PATENT NO. : 10,869,394 B1
APPLICATION NO. : 16/938212
DATED : December 15, 2020
INVENTOR(S) : Morgan It is certified that error appears in the above-identified patent and that said Letters Patent is hereby corrected as shown below:

In the Claims

In Column 11, Line 22, Claim 6, delete "the third power differing from a characteristics of the" and insert --the third power differing from a characteristic of the--;

In Column 11, Line 35, Claim 7, delete "receive the third power, the second sub-portion of the" and insert --receive a third power, the second sub-portion of the--;

In Column 11, Line 37, Claim 7, delete "to receive the fourth power." and insert --to receive a fourth power.--;

In Column 11, Line 48, Claim 8, delete "receive the third power from the first sub-portion of the" and insert --receive a third power from the first sub-portion of the--;

In Column 11, Line 51, Claim 8, delete "to receive the fourth power from the first sub-portion of" and insert --to receive a fourth power from the first sub-portion of--;

In Column 12, Line 33, Claim 15, delete "differing from a characteristics of the fourth power by" and insert --differing from a characteristic of the fourth power by--;

In Column 12, Line 54, Claim 18, delete "a power filter; and";

In Column 13, Line 19, Claim 23, delete "the third power differing from a characteristics of the" and insert --the third power differing from a characteristic of the--.

Signed and Sealed this
Thirtieth Day of March, 2021

Drew Hirshfeld
*Performing the Functions and Duties of the
Under Secretary of Commerce for Intellectual Property and
Director of the United States Patent and Trademark Office*